United States Patent [19]

Kawaguchi et al.

[11] Patent Number: 4,624,801
[45] Date of Patent: Nov. 25, 1986

[54] ANISOTROPICALLY ELECTROCONDUCTIVE ADHESIVE

[75] Inventors: Toshiyuki Kawaguchi, Saitama; Takashi Nogami, Tokyo; Koichi Nei, Chiba, all of Japan

[73] Assignee: Shin-Etsu Polymer Co., Ltd., Tokyo, Japan

[21] Appl. No.: 764,858

[22] Filed: Aug. 12, 1985

[30] Foreign Application Priority Data

Aug. 16, 1984 [JP] Japan ................................ 59-170791

[51] Int. Cl.$^4$ ............................................. H01B 1/00
[52] U.S. Cl. ..................................... 252/500; 252/511; 252/514
[58] Field of Search .................... 252/500, 511, 514; 524/590; 528/45; 525/457

[56] References Cited

U.S. PATENT DOCUMENTS

| | | | |
|---|---|---|---|
| 3,939,294 | 2/1976 | Fieldhouse | 528/45 |
| 4,144,219 | 3/1979 | Malloy | 524/590 |
| 4,356,366 | 10/1982 | Harper et al. | 252/511 |
| 4,474,934 | 10/1984 | Tanaka et al. | 528/45 |
| 4,526,952 | 7/1985 | Zeitler et al. | 252/511 |

*Primary Examiner*—Lewis T. Jacobs
*Attorney, Agent, or Firm*—Hopgood, Calimafde, Kalil, Blaustein & Judlowe

[57] ABSTRACT

The inventive electroconductive adhesive comprises a resinous matrix, as a dispersing medium of conductive particles, of a polyester-based urethane resin admixed with a masked isocyanate compound as the curing agent. By virtue of the masking of the isocyanate reactivity of the curing agent, the adhesive composition is stable during prolonged storage under a hot temperature or high-humidity condition but can exhibit curing activity when the adhesive is heated at a temperature at which the isocyanate reactivity can be restored.

5 Claims, No Drawings

ANISOTROPICALLY ELECTROCONDUCTIVE ADHESIVE

BACKGROUND OF THE INVENTION

The present invention relates to an anisotropically electroconductive adhesive or, more particularly, to an electroconductive adhesive suitable for adhesively bonding two electric circuit boards with heating under pressure and capable of imparting electroconductivity between the circuit boards in a direction perpendicular to the plane of the circuit boards.

Various types of electroconductive adhesives are known in the prior art which can be used for adhesively bonding two electric circuit boards along with establishment of electroconductivity therebetween including those prepared by dispersing a large amount of electroconductive particles in a matrix of a synthetic polymeric material such as thermoplastic resinous and rubbery materials based on polyurethane, polyester, synthetic rubber and the like and thermosetting resinous materials based on epoxy, silicone and the like. A problem in the above mentioned thermoplastics-based electroconductive adhesives is the disadvantage of the increase in the electric resistance and decrease in the adhesive bonding strength between the bonded circuit boards when they are under a high-temperature or high-humidity condition due to the weakened contact between the conductive particles and terminals with decreased in the retentive power of the matrix polymer. The thermosetting resin-based conductive adhesives have different problems. When the adhesive is of the two-package type, i.e. of the type formulated and packaged in two packages containing each different component or components from the other to be mixed together directly before use, the workability of the adhesive is not always satisfactory because of the relatively short pot life of a ready-mixed composition. When the adhesive is of the one-package type, i.e. of the type storable as ready-mixed, the pot-life is also not so long to cause gradual viscosity increase so that difficulties are sometimes encountered in the exact oontrol of the working conditions with poor productivity in mass production and the problem of the increase in the electric resistance and decrease in the adhesive bonding strength can also not be avoided.

SUMMARY OF THE INVENTION

An object of the present invention is therefore to provide an electroconductive adhesive free from the above described problems and disadvantages in the prior art adhesives and the anisotropically electroconductive adhesive of the invention comprises a matrix of an electrically insulating, thermosetting polyester-based urethane resin admixed with a masked isocyanate compound as the curing agent and electroconductive particles dispersed in the matrix.

DETAILED DESCRIPTION OF THE PREFERRED EMBODIMENTS

As is understood from the above description, the most characteristic feature of the inventive anisotropically electroconductive adhesive is in the use of a very specific thermosetting resin composition as the matrix for the dispersion of the conductive particles. When the resin composition is formulated by admixing a thermosetting polyester-based urethane resin with an isocyanate compound masked with a phenol, lactam or amide as a curing agent, unexpected advantages are obtained in the performance of the electroconductive adhesive prepared using the resin composition as the matrix for the dispersion of conductive particles therein that the conductive adhesive is freed from the problem of the increase in the electric resistance and decrease in the creeping characteristic even under a high-temperature and high-humidity condition with a sufficiently long pot life exhibiting little changes during storage for a long period of time. The present invention has been completed on the base of the above discovery after further continued investigations for the type and mixing ratio of each of the components.

The principal ingredient of the resinous matrix of the inventive electroconductive adhesive is a polyester-based urethane resin which is a reaction product of a polyester compound and a polyfunctional isocyanate compound. Exemplary of the polyester compound usable in this case are the condensation products between a dicarboxylic acid such as adipic acid, succinic acid, maleic acid, phthalic acid, sebacid acid and the like and a polyol compound such as ethyleneglycol, polyethyleneglycol, propyleneglycol, polypropyleneglycol, butyleneglycol, neopentyleneglycol, trimethylol propane, pentaerithritol and the like. The polyester compound should have an acid value as small as possible or, preferably, 8 or below with residual hydroxy groups at the molecular terminals.

The curing agent to be reacted with the polyester compound is a polyfunctional isocyanate compound which is exemplified by tolylene diisocyanates, diphenylmethane diisocyanate, hexamethylene diisocyanate, naphthalene diisocyanate and the like. It is essential in the inventive adhesive composition that the reactive isocyanate groups in the isocyanate compound are temporarily protected or masked with a suitable masking agent in a restorable manner and the reactivity of the masked isocyanate groups can readily be restored by heating or the like means when needed. Suitable masking agents are exemplified by phenols, lactams, amides, tertiary alcohols, aromatic secondary amines, sodium hydrogensulfite and the like in view of the restorability of the isocyanate reactivity of the masked isocyanate compound by heating. For example, the isocyanate reactivity of those masked with phenol, acetoacetic acid ester and hydrocyanic acid can be restored by heating at 120° to 180° C., about 140° C. and about 120° C., respectively, and the reactivity of a tolylene diisocyanate masked with phenol can be restored by heating at 140° C. These masked isocyanate compounds are stable at a temperature below the above mentioned restoring temperature without exhibiting the reactivity so that the polyester-based urethane adhesive admixed therewith has a sufficiently long pot life with little changes during storage. The mixing ratio of the masked isocyanate compound to the polyester-based urethane resin should be such that at least equimolar amount of the isocyanate groups -NCO in the masked isocyanate compound is provided to the overall content of the hydroxy groups in the above mentioned polyester oompound since deficiency in the molar amount of the isocyanate groups results in insufficient curing of the adhesive composition after heating. The molar ratio of the isocyanate groups to the hydroxy groups should preferably be in the range from 1.0 to 2.0 in consideration of the deactivation of the isocyanate reactivity by the unavoidable moisture contained in the adhesive composition or coming from the atmosphere.

The type of the electroconductive particles dispersed in the above described resinous matrix is not particularly limitative and any known conductive particles can be used including particles of metals and alloys such as gold, silver, palladium, nickel, tin, tungsten, solder alloys and the like, particles of a conductive ceramic such as molybdenum silicide, tungsten carbide, titanium carbide and the like and particles of carbonaceous materials. Although a fibrous form of these conductive materials can be used in some cases, the particles should preferably have a spherical particulate configuration as far as possible. The particle size or diameter of the conductive particles should not exceed usually one third of the pitch of the terminals provided on the circuit boards to be adhesively bonded by use of the inventive adhesive. The amount of the conductive particles should preferably be in the range from 5 to 30% by volume based on the overall volume of the inventive adhesive composition.

It is optional that the electroconductive adhesive composition of the invention is further admixed according to need with various kinds of known additives such as an adhesion accelerator, e.g. tin (II) chloride, pigment and the like in addition to the above described essential components of the resinous matrix composed of the polyester-based urethane resin and a masked isocyanate compound as a curing agent and conductive particles.

The electroconductive adhesive composition of the invention is solid at room temperature and stable when stored at a temperature below the temperature above which the reactivity of the masked isocyanate compound is restored. It is of course that full curing of the adhesive can be obtained by heating the adhesive after application to the substrate surface at a temperature above the restoring temperature of the isocyanate reactivity but no preliminary heating is necessary prior thereto. When heated, the adhesive composition is first melted and then the curing reaction takes place by the restoration of the isocyanate reactivity to exhibit the effect of adhesive bonding. Curing of the adhesive composition with heating should be performed preferably under pressure of, for example, 5 to 30 kg/cm$^2$ in order that electric connection can be established between terminals bonded therewith by the conductive particles which shove the resinous matrix aside to reach the substrate surface.

In the bonding works of circuit boards by use of the inventive electroconductive adhesive composition, it is sufficient that the adhesive is applied to either one of the circuit boards to be adhesively bonded, for example, by the method of thick-film printing and the like. It is a convenient way that the adhesive composition is shaped in advance in a film-like form by use of an extrusion molding machine or coater and the pre-shaped adhesive film is cut into a desired size so that application of the adhesive can be performed by merely placing the cut-sheet of the adhesive on the substrate surface. The thickness of the pre-shaped adhesive film should be in the range from a half to 1.5 times of or, preferably, smaller than the average particle diameter of the conductive particles dispersed therein because a larger thickness of the adhesive film may result in the increase of the volume of the insulating resinous matrix to be shoved aside by the conductive particles under pressure so that the electric resistance between the conductive particles and the terminals may be unduly increased while no sufficient adhesive bonding strength can be obtained with an adhesive film having a too small thickness as a matter of course.

In the following, the electroconductive adhesive composition of the invention is described in more detail by way of an example.

EXAMPLE

An electroconductive adhesive composition was prepared by uniformly blending 63 parts by weight of a thermoplastic polyester-based adhesive resin (PES-110H, a product by Toa Gosei Kagaku Kogyo Co. of Japan) 51 parts by weight of a polyester polyol (Takelac U-53, a product by Takeda Yakuhin Kogyo Co.), 80 parts by weight of a thinner solvent (PES Thinner, a product by Toa Gosei Kagaku Kogyo Co.), 1 part by weight of tin (IV) chloride as a curing accelerator, 35 parts by weight of a phenol-masked tolylene diisocyanate (Coronate AP, Type Stable M, a product by Nippon Polyurethane Co.) and 169 parts by weight of an electroconductive tungsten carbide powder #350 (a product by Fukuda Kinzoku Hakufun Kogyo Co. of Japan).

The thus prepared adhesive composition was applied in a film thickness of 30 μm to the surface of a flexible circuit board having terminals at a pitch of 0.2 mm by the technique of screen printing and kept standing for 1 month in a hot air oven at 100° C. Thereafter, a glass fiber-reinforced epoxy resin circuit board having terminals at a pitch of 0.2 mm was laid on the adhesive-coated flexible circuit board and heated at 180° C. for 30 seconds under a pressure of 110 kg/cm$^2$ so that the circuit boards were adhesively bonded together. The thus adhesively bonded circuit boards were subjected to the tests of the adhesive bonding strength therebetween against peeling at an angle of 90° and the electric resistance between the oppositely facing terminals to find that the average peeling resistance was 420 g/cm and the average electric resistance was 0.62 ohm including the circuit resistance of 0.21 ohm.

For comparison, the same tests as above were performed of the circuit boards as bonded, i.e. with omission of the storage at 100° C. for 1 month, to find that the average peeling resistance was 450 g/cm and the average electric resistance was 0.63 ohm indicating that the storage at 100° C. for 1 month had an effect of decreasing the peeling resistance by only 6.7% and had almost no effect on the electric resistance.

What is claimed is:

1. An electroconductive adhesive composition which comprises a matrix of an electrically insulating, thermosetting polyester-based urethane resin admixed with a masked isocyanate compound as the curing agent and electroconductive particles dispersed in the matrix.

2. The electroconductive adhesive composition as claimed in claim 1 wherein the thermosetting polyester-based urethane resin is a reaction product of a polyester compound having an acid value of 8 or smaller and a polyfunctional isocyanate compound.

3. The electroconductive adhesive composition as claimed in claim 1 wherein the masked isocyanate compound is an isocyanate compound masked with a masking agent selected from the group consisting of phenols, lactams, amides, tertiary alcohols, aromatic secondary amines and sodium hydrogensulfite.

4. The electroconductive adhesive composition as claimed in claim 1 wherein the amount of the masked isocyanate compound is such that at least an equimolar amount of the isocyanate groups therein is provided to the hydroxy groups in the polyester-based urethane resin.

5. The electroconductive adhesive composition as claimed in claim 1 wherein the amount of the electroconductive particles is in the range from 5 to 30% by volume based on the overall volume of the adhesive composition.

* * * * *